(12) United States Patent
Dimaano, Jr. et al.

(10) Patent No.: US 7,482,683 B2
(45) Date of Patent: Jan. 27, 2009

(54) INTEGRATED CIRCUIT ENCAPSULATION SYSTEM WITH VENT

(75) Inventors: Antonio B. Dimaano, Jr., Singapore (SG); Erick Dahilig, Singapore (SG); Sheila Marie L. Alvarez, Singapore (SG); Robinson Quiazon, Singapore (SG); Jose Alvin Caparas, Singapore (SG)

(73) Assignee: Stats Chippac Ltd., Singapore (SG)

( * ) Notice: Subject to any disclaimer, the term of this patent is extended or adjusted under 35 U.S.C. 154(b) by 270 days.

(21) Appl. No.: 11/383,038

(22) Filed: May 12, 2006

(65) Prior Publication Data

US 2007/0262423 A1   Nov. 15, 2007

(51) Int. Cl.
*H01L 23/22* (2006.01)
*H01L 23/24* (2006.01)
(52) U.S. Cl. .............. 257/687; 257/787; 257/E23.116
(58) Field of Classification Search ............. 257/687, 257/787, E23.116
See application file for complete search history.

(56) References Cited

U.S. PATENT DOCUMENTS

| 6,291,274 B1 * | 9/2001 | Oida et al. .......... 438/123 |
| 6,650,020 B2 * | 11/2003 | Yamada et al. ........ 257/783 |
| 6,800,507 B2 | 10/2004 | Kasuga et al. |
| 6,861,294 B2 | 3/2005 | Tsunoda et al. |
| 6,875,639 B2 | 4/2005 | Arai et al. |
| 6,897,093 B2 | 5/2005 | Kasuga et al. |
| 6,969,918 B1 | 11/2005 | James et al. |

\* cited by examiner

*Primary Examiner*—Phat X Cao
(74) *Attorney, Agent, or Firm*—Mikio Ishimaru (57) ABSTRACT

An integrated circuit encapsulation system with vent is provided including providing a sheet material, forming a leadframe array on the sheet material, forming a leadframe air vent on the leadframe array, attaching an integrated circuit to the leadframe array, mounting the leadframe array in a mold and encapsulating the integrated circuit and the leadframe array.

20 Claims, 6 Drawing Sheets

INTEGRATED CIRCUIT ENCAPSULATION SYSTEM WITH VENT

TECHNICAL FIELD

The present invention relates generally to integrated circuit package systems, and more particularly to a system for flipchip quad leaded package system.

BACKGROUND ART

In the manufacture of a semiconductor device, a method is known in which a plurality of semiconductor chips mounted on a main surface of a substrate are block-molded with one resin enclosure, and then the resin enclosure and the substrate are simultaneously separated into respective semiconductor chips. These chips are used in many of today's popular electronic devices, such as personal audio/video players, cellular telephones, and high definition television. In the manufacturing process, molten encapsulant, such as resin or epoxy molding compound (EMC) is injected, under constant pressure, into a mold cavity containing leadframes and integrated circuits. As the molten encapsulant moves through the mold cavity, it is possible for air within the mold cavity to become trapped. This trapped air causes voids in the encapsulant that makes some packages defective.

In an effort to design molds that assist in the resolution of the void problem, modern molds have air vents arranged opposite the mold gate that acts as an inlet for the molten encapsulant. The air vents assisted in reducing the pressure required to fill the mold and reduced the occurrence of voids in the packages. Care must be taken to exhaust the air at a correct rate. The air is used to develop a back pressure within the mold assuring the flow of molding compound into all areas of the mold enclosure.

As devices get progressively smaller and the packages get thinner, voids persist in the package structure. Many approaches have been investigated to resolve the manufacturing fall-out caused by voids in the packages. To date there hasn't been a completely successful solution for flipchip quad leadless packages (FC-QLP). Due to the thin nature of the packages and the openness of the leadframes, air is pressured into spaces that are difficult to vent.

Thus, a need still remains for a solution to the package void issues in flipchip quad leadless packages. In view of the demand for high volume very thin packages for electronic devices, it is increasingly critical that answers be found to these problems. Solutions to these problems have been long sought but prior developments have not taught or suggested any solutions and, thus, solutions to these problems have long eluded those skilled in the art.

DISCLOSURE OF THE INVENTION

The present invention provides an integrated circuit encapsulation system with vent including providing a sheet material, forming a leadframe array on the sheet material, forming a leadframe air vent on the leadframe array, attaching an integrated circuit to the leadframe array, mounting the leadframe array in a mold and encapsulating the integrated circuit and the leadframe array.

Certain embodiments of the invention have other aspects in addition to or in place of those mentioned or obvious from the above. The aspects will become apparent to those skilled in the art from a reading of the following detailed description when taken with reference to the accompanying drawings.

BEST MODE FOR CARRYING OUT THE INVENTION

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the apparatus/device are semi-diagrammatic and not to scale and, particularly, some of the dimensions are for the clarity of presentation and are shown greatly exaggerated in the drawing FIG's. Where multiple embodiments are disclosed and described having some features in common, for clarity and ease of illustration, description, and comprehension thereof, similar and like features one to another will ordinarily be described with like reference numerals.

The term "horizontal" as used herein is defined as a plane parallel to the conventional plane or surface of the leadframe, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means there is direct contact among elements. The term "processing" as used herein includes deposition of material or photoresist, patterning, exposure, development, etching, cleaning, and/or removal of the material or photoresist as required in forming a described structure.

Figure 1:
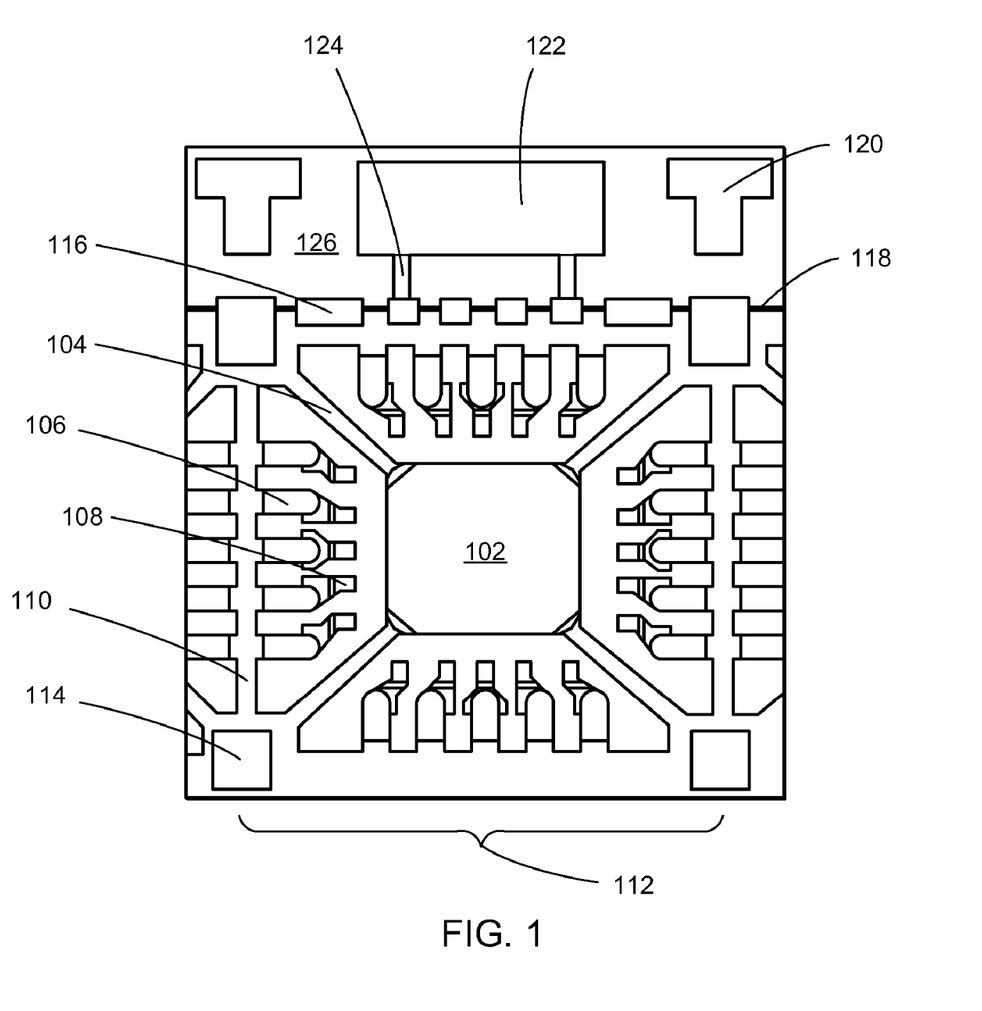
FIG. 1 is a plan view of an integrated circuit encapsulation system with vent, in an embodiment of the present invention.

Referring now to FIG. 1, therein is shown a plan view of an integrated circuit encapsulation system with vent 100, in an embodiment of the present invention. The plan view includes a die paddle 102, a half-etched tie bar 104, contact leads 106 having half-etched inner contacts 108 are connected to half-etched lead stringers 110. These elements form a flipchip leadframe 112. The plan view also includes a corner aperture 114, array boundaries 116 that are connected by an etching trench 118, singulation markers 120, an array reservoir 122, and a leadframe air vent 124 that connects the array boundaries 116 to the array reservoir 122.

The leadframe air vent 124 is formed on a sheet material 126 by a manufacturing process, such as half-etching, stamping, laser etching or a similar process. The leadframe air vent 124 is adjacent and approximately the same thickness as the half-etched tie bar 104 and the half-etched lead stringers 110, which are in the last row of the flipchip leadframe 112. The sheet material 126, such as copper, tin, PPF or similar alloy finish proximate the leadframe air vent 124 is full height and un-etched. This strategy allows an escape path for air that is compressed into the last row of the flipchip leadframe 112 in a molding process.

Figure 2:
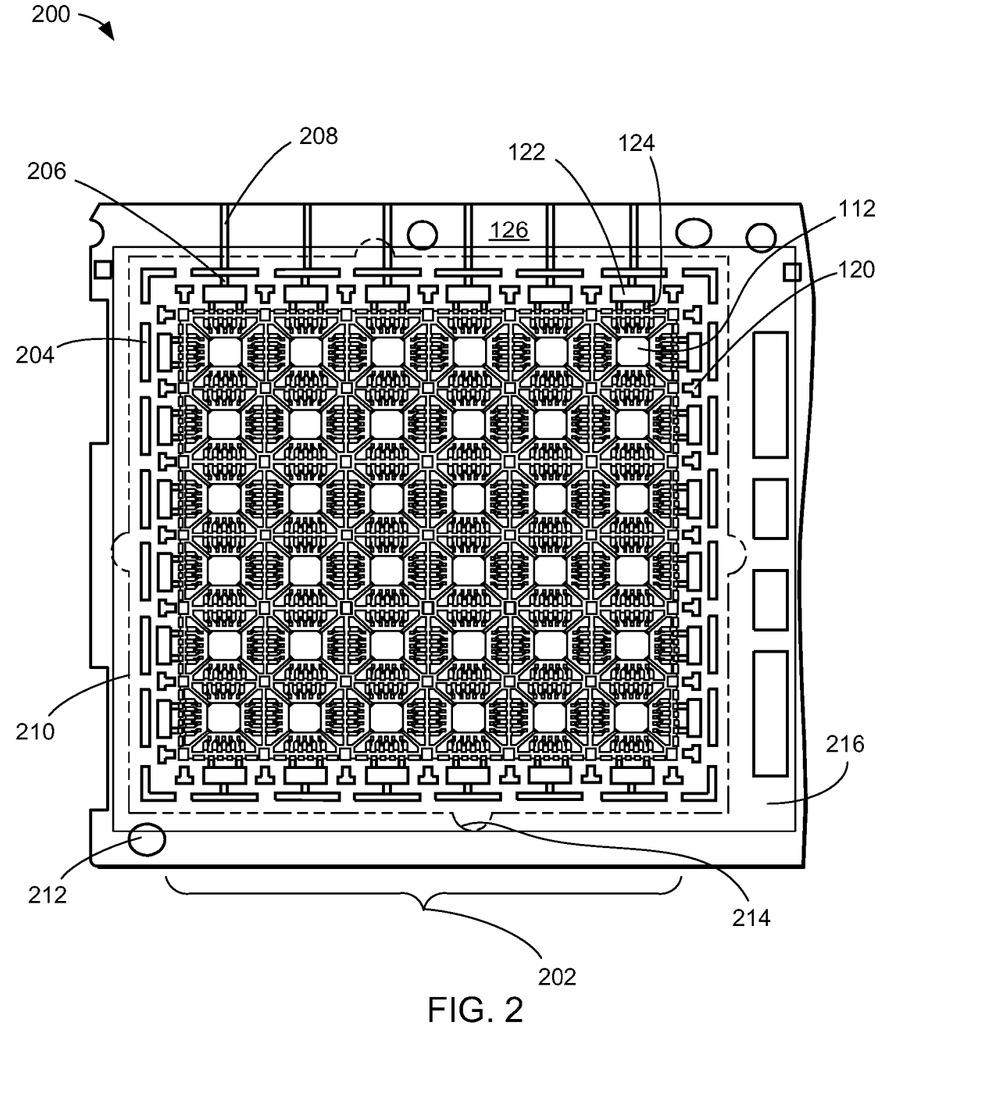
FIG. 2 is a plan view of a leadframe array, in an embodiment of the present invention.

Referring now to FIG. 2, therein is shown a plan view of a leadframe array 200, in an embodiment of the present invention. The plan view depicts a flipchip leadframe array 202 of the flipchip leadframe 112 patterned on the sheet material 126 in preparation for the molding process. The singulation markers 120 indicate the boundary of the individual devices in the flipchip leadframe array 202. An outer reservoir 204 is positioned outside the array reservoir 122. A reservoir vent 206 is positioned between the array reservoir 122 and the outer reservoir 204 allowing a further air path during the molding process. An external air vent 208 allows the compressed air in the last row to escape to the outside environment. An encapsulation device outline 210 indicates where the encapsulation device (not shown) will contact the sheet material 126. An alignment aperture 212 is used to position the flipchip leadframe array 202 correctly in the encapsulation device (not shown). The protrusion on the mold outline 210 indicates the position of an ejector pin area 214 that will allow the encapsulated device (not shown) to be released from mold cavity (not shown) after injection process has been completed. A tape adhesive layer 216 may be applied to the flipchip leadframe array 202 after the flipchip leadframe array 202 has been through the half etch process, or similar process. The tape adhesive layer 216 may be optionally applied to the bottom side of the flipchip leadframe array 202 in order to prevent mold bleed in a subsequent process step.

Figure 3:
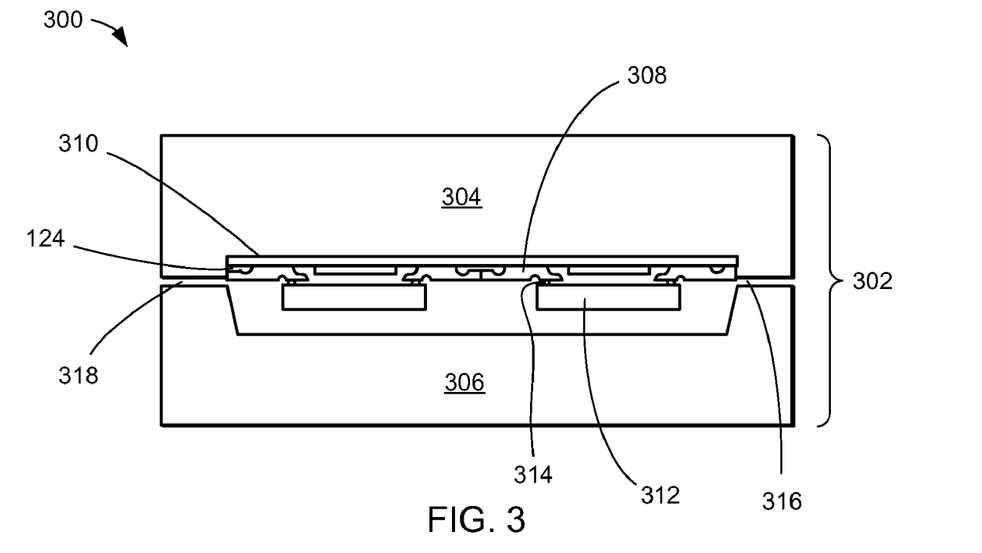
FIG. 3 is a cross-sectional view of a leadframe array mounted in a mold.

Referring now to FIG. 3, therein is shown a cross-sectional view of a leadframe array 308 mounted in a mold 302. The cross-sectional view depicts the mold 302 having a top mold chase 304 and a bottom mold chase 306. A leadframe array 308 is picked by a mechanical picker (not shown), or equivalent, and placed into the top mold chase 304 with an adhesive tape 310 adhered to the bottom of the leadframe array 308. The leadframe array 308 has a flipchip integrated circuit 312 attached by interconnect structures 314, such as solder balls. The mold 302 has a mold gate 316, through which epoxy molding compound (EMC) is injected into the mold cavity. At the opposite end of the mold 302, a mold air vent 318 allows the compressed air to escape during the molding process. The leadframe air vent 124 is a feature of the leadframe array 308 and is positioned proximate the mold air vent 318.

By controlling the amount of air leaving the mold 302 at any time in the injection process, the air is used to provide a back pressure within the mold 302. The back pressure forces the EMC into all areas of the top mold chase 304 and the bottom mold chase 306 and the volume between them. As the back pressure decreases, due to the exhaust of the air from the mold 302, the injected EMC will push all of the residual air out of the mold 302 through the leadframe air vent 124 and the mold air vent 318.

Figure 4:
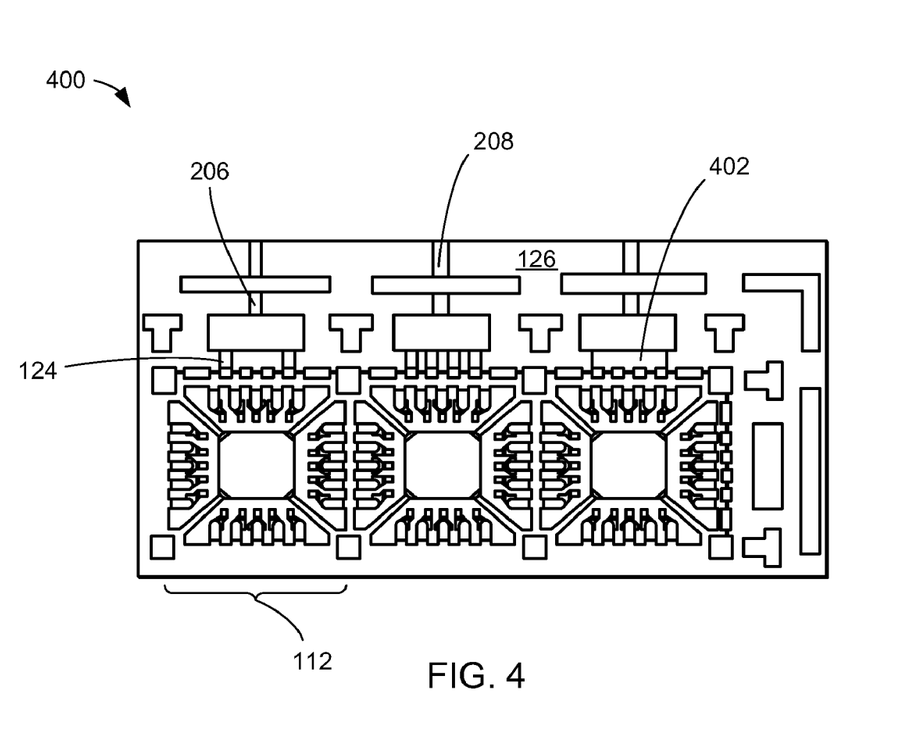
FIG. 4 is a plan view of a segment of the leadframe array, of FIG. 2.

Referring now to FIG. 4, therein is shown a plan view of a leadframe array segment 400 of the leadframe array 200, of FIG. 2. The plan view of the leadframe array segment 400 depicts an array of the flipchip leadframe 112 from the last row of the leadframe array 200. The sheet material 126 is half-etched in the area around the flipchip leadframe 112. The leadframe air vent 124 can be configured in many possible ways. The leadframe air vent 124 can be used in any number as shown in the figure or it can be configured as a contiguous air vent 402 as shown on the right of the figure. The contiguous air vent 402 covers a wider area than the leadframe air vent 124. This region is half-etched, stamped or laser etched to reduce the thickness of the sheet material 126 and allow an escape path for trapped air. A similar position can be assumed by the reservoir vent 206 and the external air vent 208.

Figure 5:
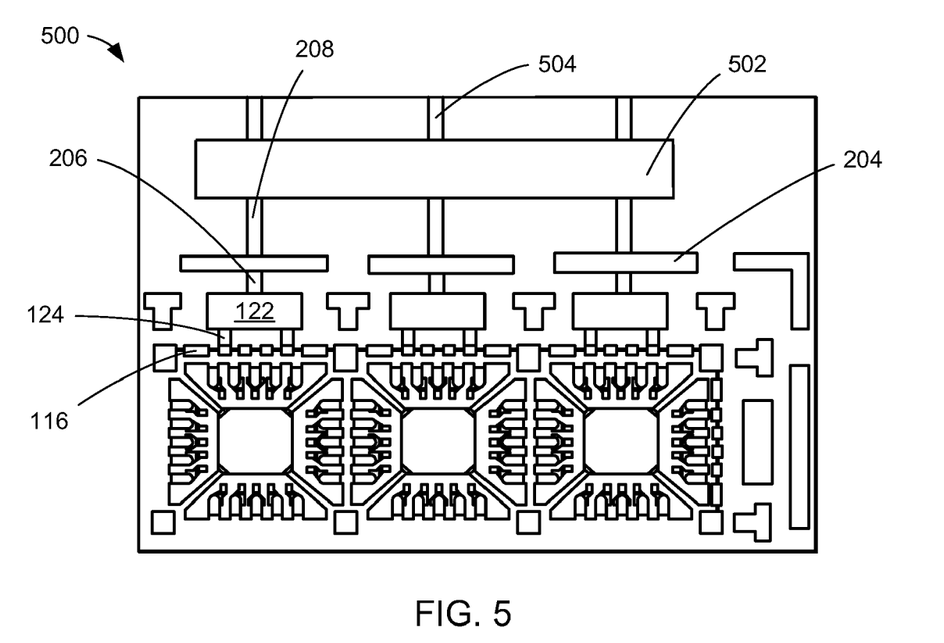
FIG. 5 is a plan view of a segment of the flipchip leadframe array, in an alternative embodiment of the leadframe array, of FIG. 2.

Referring now to FIG. 5, therein is shown a plan view of a segment 500 of the flipchip leadframe array 202, in an alternative embodiment of the leadframe array 200, of FIG. 2. The plan view of the segment 500 depicts the leadframe air vent 124 providing an air path between the array boundaries 116 to the array reservoir 122. The reservoir vent 206 is positioned between the array reservoir 122 and the outer reservoir 204 allowing a further air path during the molding process. The external air vent 208 forms a path between the outer reservoir 204 and a balancing reservoir 502. The balancing reservoir 502 equalizes the air pressure in multiple paths. This mechanism assists in maintaining equal pressure within the mold 302, of FIG. 3, as air is forced out of the mold 302. An extension air vent 504 connects the balancing reservoir 502 to the outside environment.

Figure 6:
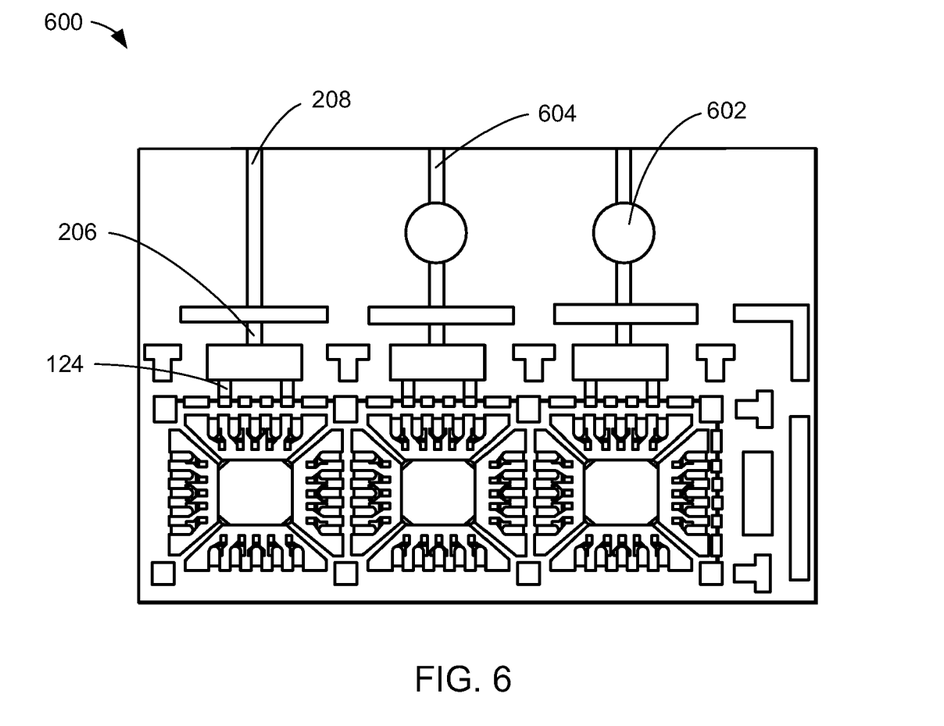
FIG. 6 is a plan view of a segment of the flipchip leadframe array, in an alternative embodiment of the leadframe array, of FIG. 2.

Referring now to FIG. 6, therein is shown a plan view of a segment 600 of the flipchip leadframe array 202, in an alternative embodiment of the leadframe array 200, of FIG. 2. The plan view of the segment 600 depicts the leadframe air vent 124 providing an air path between the array boundaries 116 to the array reservoir 122. The reservoir vent 206 is positioned between the array reservoir 122 and the outer reservoir 204 allowing a further air path during the molding process. The external air vent 208 forms a path between the outer reservoir 204 and the outside environment or a slot hole 602. The slot hole 602 passes air to the outside environment through an end air vent 604.

Figure 7:
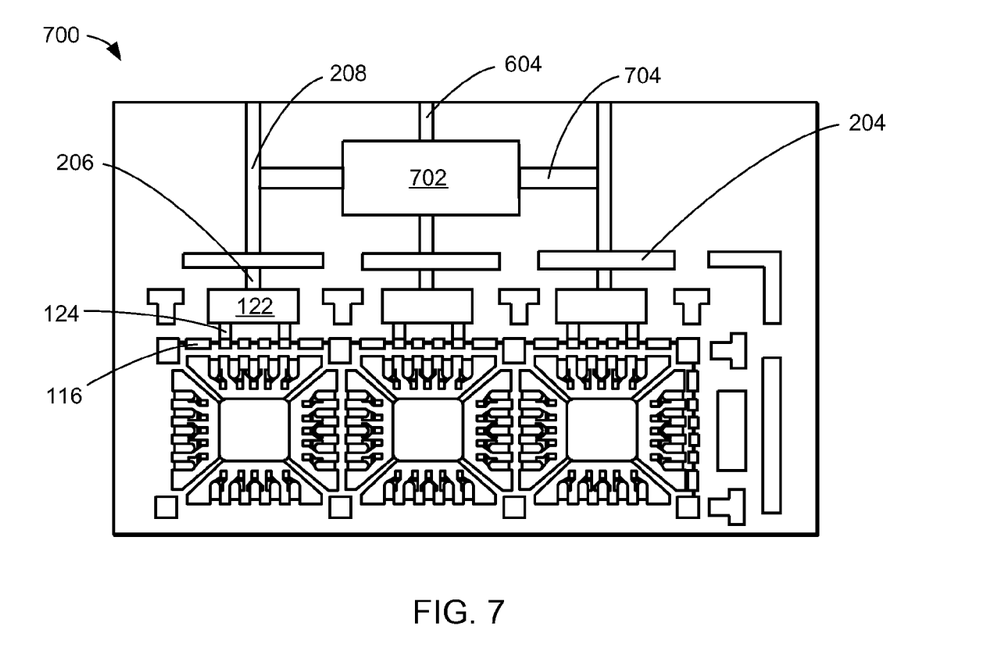
FIG. 7 is a plan view of a segment of the flipchip leadframe array, in an alternative embodiment of the leadframe array, of FIG. 2.

Referring now to FIG. 7, therein is shown a plan view of a segment 700 of the flipchip leadframe array 202, in an alternative embodiment of the leadframe array 200, of FIG. 2. The plan view of the segment 700 depicts a reservoir and air vent channel concept. In this concept air passes through the leadframe air vent 124, the array reservoir 122, the reservoir vent 206, and the outer reservoir 204. From the outer reservoir 204 the air travels through the external air vent 208 to the outside environment or to a small balancing reservoir 702. Air can exit the small balancing reservoir 702 through a cross vent 704 to the external air vent 208 or it can escape directly to the outside environment through the end air vent 604.

Figure 8:
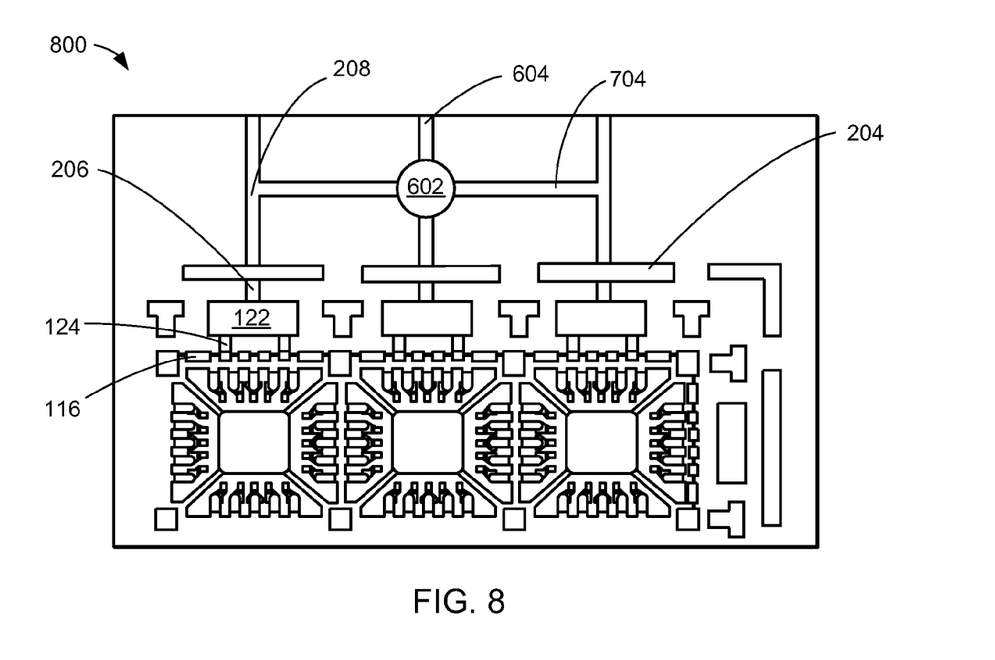
FIG. 8 is a plan view of a segment of the flipchip leadframe array, in an alternative embodiment of the leadframe array, of FIG. 2.

Referring now to FIG. 8, therein is shown a plan view of a segment 800 of the flipchip leadframe array 202, in an alternative embodiment of the leadframe array 200, of FIG. 2. The plan view of the segment 800 depicts a slot hole and air vent channel concept. In this concept air passes through the leadframe air vent 124, the array reservoir 122, the reservoir vent 206, and the outer reservoir 204. From the outer reservoir 204 the air travels through the external air vent 208 to the outside environment or to the slot hole 602. Air can exit the slot hole 602 through a cross vent 704 to the external air vent 208 or it can escape directly to the outside environment through the end air vent 604.

Figure 9:
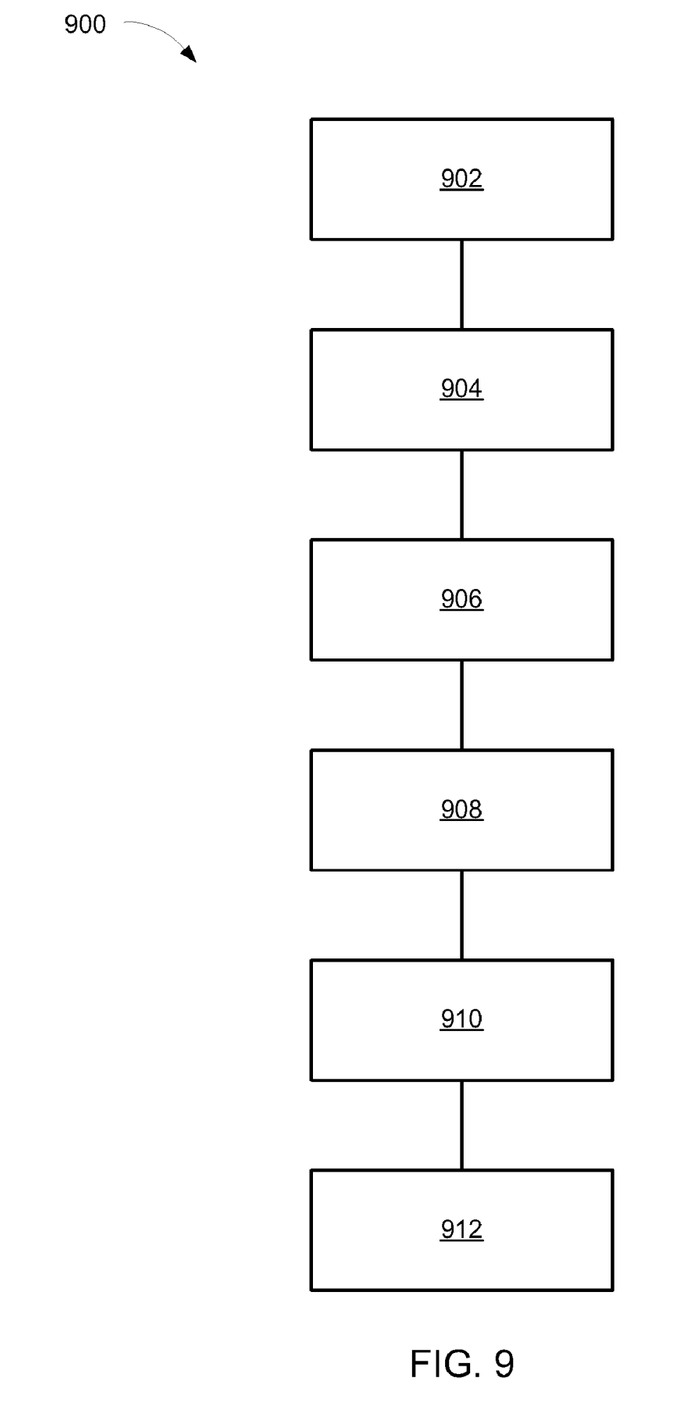
FIG. 9 is a flow chart of an integrated circuit encapsulation system with vent for manufacturing the integrated circuit encapsulation system with vent in an embodiment of the present invention.

Referring now to FIG. 9, therein is shown a flow chart of an integrated circuit encapsulation system with vent 900 for manufacturing the integrated circuit encapsulation system with vent in an embodiment of the present invention. The system 900 includes providing a sheet material in a block 902; forming a leadframe array on the sheet material in a block 904; forming a leadframe air vent on the leadframe array in a block 906; attaching an integrated circuit to the leadframe array in a block 908; mounting the leadframe array in a mold in a block 910; and encapsulating the integrated circuit and the leadframe array in a block 912.

In greater detail, a method to manufacture an integrated circuit encapsulation system with vent, in an embodiment of the present invention, is performed as follows:

1. Providing a sheet material includes providing a copper sheet. (FIG. 2)
2. Forming a leadframe array on the sheet material. (FIG. 2)
3. Forming a leadframe air vent on the leadframe array includes stamping or etching. (FIG. 2)
4. Adhering a tape adhesive layer on the leadframe array, optionally to prevent mold bleed. (FIG. 2)
5. Attaching an integrated circuit to the leadframe array. (FIG. 2)
6. Mounting the leadframe array in a mold. (FIG. 3) and
7. Encapsulating the integrated circuit and the leadframe array. (not shown)

It has been discovered that certain flipchip quad leadless packages (FC-QLP) develop voids in the package due to air trapped in the mold during encapsulation. These voids render the package or packages defective.

It has been discovered that the present invention thus has numerous aspects.

An aspect is that the present invention is that it prevents voids from forming in the package of FC-QLP devices during encapsulation.

Another aspect is that the enhancement in manufacturability improves the package yield by preventing voids.

Yet another important aspect of the present invention is that it valuably supports and services the historical trend of reducing costs, simplifying systems, and increasing performance. By preventing waste in the manufacturing process, the present invention reduces cost and preserves the resources required to fabricate devices.

These and other valuable aspects of the present invention consequently further the state of the technology to at least the next level.

Thus, it has been discovered that the integrated circuit encapsulation system with vent method and apparatus of the present invention furnishes important and heretofore unknown and unavailable solutions, capabilities, and functional aspects for manufacturing the FC-QLP. The resulting processes and configurations are straightforward, cost-effective, uncomplicated, highly versatile and effective, can be implemented by adapting known technologies, and are thus readily suited for efficiently and economically manufacturing FC-QLP devices fully compatible with conventional manufacturing processes and technologies.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the scope of the included claims. All matters hithertofore set forth herein or shown in the accompanying drawings are to be interpreted in an illustrative and non-limiting sense.

What is claimed is:

1. An integrated circuit encapsulation system with vent comprising:
    providing a sheet material;
    forming a leadframe array on the sheet material;
    forming a leadframe air vent adjacent to a lead stringer in the last row on the leadframe array;
    attaching an integrated circuit to the leadframe array;
    mounting the leadframe array in a mold; and
    encapsulating the integrated circuit and the leadframe array.

2. The system as claimed in claim 1 further comprising forming a half-etched flipchip leadframe within the leadframe array.

3. The system as claimed in claim 1 wherein forming the leadframe air vent includes half-etching a path for air to escape the mold.

4. The system as claimed in claim 1 further comprising forming a reservoir, a slot hole, or a combination thereof on the leadframe array.

5. The system as claimed in claim 1 wherein encapsulating the leadframe array comprises injecting an encapsulant into the mold and forcing air out the leadframe air vent.

6. An integrated circuit encapsulation system with vent comprising:
    providing a sheet material includes providing a copper sheet;
    forming a leadframe array on the sheet material;
    forming a leadframe air vent adjacent to a lead stringer in the last row on the leadframe array, for venting air during the encapsulation process, includes stamping or etching;
    attaching an integrated circuit to the leadframe array;
    mounting the leadframe array in a mold comprises attaching an adhesive tape between the leadframe array and the mold; and
    encapsulating the integrated circuit and the leadframe array.

7. The system as claimed in claim 6 further comprising forming a half-etched flipchip leadframe within the leadframe array.

8. The system as claimed in claim 6 wherein forming the leadframe air vent includes half-etching a path for air to escape the mold.

9. The system as claimed in claim 6 further comprising forming a reservoir, a slot hole, or a combination thereof.

10. The system as claimed in claim 6 wherein encapsulating the leadframe array comprises injecting an encapsulant into the mold and forcing air out the leadframe air vent.

11. An integrated circuit encapsulation system with vent comprising:
    a sheet material;
    a leadframe array formed on the sheet material;
    a leadframe air vent formed adjacent to a lead stringer in the last row on the leadframe array;
    an integrated circuit attached to the leadframe array;
    the leadframe array mounted in a mold; and
    the integrated circuit and the leadframe array encapsulated.

12. The system as claimed in claim 11 further comprising a half-etched flipchip leadframe formed within the leadframe array.

13. The system as claimed in claim 11 wherein the leadframe air vent includes half-etching a path for air to escape the mold.

14. The system as claimed in claim 11 further comprising a reservoir, a slot hole, or a combination thereof formed on the leadframe array.

15. The system as claimed in claim 11 wherein the leadframe array encapsulated comprises an encapsulant injected into the mold and air forced out the leadframe air vent.

16. The system as claimed in claim 11 wherein:
the sheet material includes copper, and
the leadframe air vent includes stamping or etching; and further comprises:
an adhesive tape attached between the leadframe array and the mold.

17. The system as claimed in claim 16 further comprising a half-etched flipchip leadframe formed within the leadframe array.

18. The system as claimed in claim 16 wherein the leadframe air vent includes half-etching a path for air to escape the mold.

19. The system as claimed in claim 16 further comprising a reservoir, a slot hole, or a combination thereof formed on the leadframe array.

20. The system as claimed in claim 16 wherein the leadframe array encapsulated comprises an encapsulant injected into the mold and air forced out the leadframe air vent.

* * * * *